(12) United States Patent
Piner et al.

(10) Patent No.: US 7,365,374 B2
(45) Date of Patent: Apr. 29, 2008

(54) GALLIUM NITRIDE MATERIAL STRUCTURES INCLUDING SUBSTRATES AND METHODS ASSOCIATED WITH THE SAME

(75) Inventors: Edwin L. Piner, Cary, NC (US); Pradeep Rajagopal, Raleigh, NC (US); John C. Roberts, Hillsborough, NC (US); Kevin J. Linthicum, Cary, NC (US)

(73) Assignee: Nitronex Corporation, Durham, NC (US)

( * ) Notice: Subject to any disclaimer, the term of this patent is extended or adjusted under 35 U.S.C. 154(b) by 0 days.

(21) Appl. No.: 11/121,793

(22) Filed: May 3, 2005

(65) Prior Publication Data

US 2006/0249748 A1  Nov. 9, 2006

(51) Int. Cl.
*H01L 31/0328* (2006.01)

(52) U.S. Cl. .................... 257/189; 257/183; 257/191

(58) Field of Classification Search ................ 257/189, 257/183, 191
See application file for complete search history.

(56) References Cited

U.S. PATENT DOCUMENTS

| | | | |
|---|---|---|---|
| 5,192,987 A | 3/1993 | Khan et al. | |
| 5,239,188 A | 8/1993 | Takeuchi et al. | |
| 5,290,393 A | 3/1994 | Nakamura | |
| 5,296,395 A | 3/1994 | Khan et al. | |
| 5,389,571 A | 2/1995 | Takeuchi et al. | |
| 5,393,993 A | 2/1995 | Edmond et al. | |
| 5,523,589 A | 6/1996 | Edmond et al. | |
| 5,633,192 A | 5/1997 | Moustakas et al. | |
| 5,679,965 A | 10/1997 | Schetzina | |
| 5,690,736 A * | 11/1997 | Tokunaga ................ 117/86 |
| 5,739,554 A | 4/1998 | Edmond et al. | |
| 5,741,724 A | 4/1998 | Ramandi et al. | |
| 5,760,426 A | 6/1998 | Marx et al. | |
| 5,786,606 A | 7/1998 | Nishio et al. | |
| 5,815,520 A | 9/1998 | Furushima | |
| 5,838,029 A | 11/1998 | Shakuda | |
| 5,838,706 A | 11/1998 | Edmond et al. | |

(Continued)

FOREIGN PATENT DOCUMENTS

JP  2000-311863  * 11/2000

(Continued)

OTHER PUBLICATIONS

Brown, J.D. et al., "AlGaN/GaN HFETs Fabricated on 100-mm GaN on Silicon (111) Substrates," Solid-State Electronics 46:1535 (2002).

(Continued)

*Primary Examiner*—Evan Pert
*Assistant Examiner*—Tan Tran
(74) *Attorney, Agent, or Firm*—Wolf, Greenfield & Sacks, P.C.

(57) ABSTRACT

Gallium nitride material-based semiconductor structures are provided. In some embodiments, the structures include a composite substrate over which a gallium nitride material region is formed. The gallium nitride material structures may include additional features, such as strain-absorbing layers and/or transition layers, which also promote favorable stress conditions. The reduction in stresses may reduce defect formation and cracking in the gallium nitride material region, as well as reducing warpage of the overall structure. The gallium nitride material-based semiconductor structures may be used in a variety of applications such as transistors (e.g. FETs) Schottky diodes, light emitting diodes, laser diodes, SAW devices, and sensors, amongst others devices.

19 Claims, 4 Drawing Sheets

U.S. PATENT DOCUMENTS

| | | |
|---|---|---|
| 5,874,747 A | 2/1999 | Redwing et al. |
| 5,929,467 A | 7/1999 | Kawai et al. |
| 6,051,849 A | 4/2000 | Davis et al. |
| 6,064,078 A | 5/2000 | Northrup et al. |
| 6,064,082 A | 5/2000 | Kawai et al. |
| 6,069,021 A | 5/2000 | Terashima et al. |
| 6,100,545 A | 8/2000 | Chiyo et al. |
| 6,120,600 A | 9/2000 | Edmond et al. |
| 6,121,121 A | 9/2000 | Koide |
| 6,139,628 A | 10/2000 | Yuri et al. |
| 6,146,457 A | 11/2000 | Solomon |
| 6,153,010 A | 11/2000 | Kiyoku et al. |
| 6,156,581 A | 12/2000 | Vaudo et al. |
| 6,177,688 B1 | 1/2001 | Linthicum et al. |
| 6,180,270 B1 | 1/2001 | Cole et al. |
| 6,201,262 B1 | 3/2001 | Edmond et al. |
| 6,255,198 B1 | 7/2001 | Linthicum et al. |
| 6,261,929 B1 | 7/2001 | Gehrke et al. |
| 6,261,931 B1 | 7/2001 | Keller et al. |
| 6,265,289 B1 | 7/2001 | Zheleva et al. |
| 6,291,319 B1 | 9/2001 | Yu et al. |
| 6,328,796 B1 | 12/2001 | Kub et al. |
| 6,329,063 B2 | 12/2001 | Lo et al. |
| 6,380,108 B1 | 4/2002 | Linthicum et al. |
| 6,391,748 B1 | 5/2002 | Temkin et al. |
| 6,403,451 B1 | 6/2002 | Linthicum et al. |
| 6,420,197 B1 | 7/2002 | Ishida et al. |
| 6,426,512 B1 | 7/2002 | Ito et al. |
| 6,440,823 B1 | 8/2002 | Vaudo et al. |
| 6,441,393 B2 | 8/2002 | Goetz et al. |
| 6,459,712 B2 | 10/2002 | Tanaka et al. |
| 6,465,814 B2 | 10/2002 | Kasahara et al. |
| 6,486,502 B1 | 11/2002 | Sheppard et al. |
| 6,497,763 B2 | 12/2002 | Kub et al. |
| 6,498,111 B1 | 12/2002 | Kapolnek et al. |
| 6,521,514 B1 | 2/2003 | Gehrke et al. |
| 6,524,932 B1 | 2/2003 | Zhang et al. |
| 6,548,333 B2 | 4/2003 | Smith |
| 6,583,034 B2 | 6/2003 | Ramdani et al. |
| 6,583,454 B2 | 6/2003 | Sheppard et al. |
| 6,586,781 B2 | 7/2003 | Wu et al. |
| 6,610,144 B2 | 8/2003 | Mishra et al. |
| 6,611,002 B2 | 8/2003 | Weeks et al. |
| 6,617,060 B2 | 9/2003 | Weeks et al. |
| 6,624,452 B2 | 9/2003 | Yu et al. |
| 6,649,287 B2 | 11/2003 | Weeks, Jr. et al. |
| 6,765,240 B2 | 7/2004 | Tischler et al. |
| 6,765,241 B2 | 7/2004 | Ohno et al. |
| 6,777,278 B2 | 8/2004 | Smith |
| 6,841,409 B2 | 1/2005 | Onishi |
| 6,849,882 B2 | 2/2005 | Chavarkar et al. |
| 2001/0042503 A1 | 11/2001 | Lo et al. |
| 2002/0020341 A1 | 2/2002 | Marchand et al. |
| 2002/0117695 A1 | 8/2002 | Borges |
| 2002/0187356 A1* | 12/2002 | Weeks et al. ............... 428/446 |
| 2003/0045103 A1* | 3/2003 | Suzuki et al. ............... 438/689 |
| 2003/0064535 A1 | 4/2003 | Kub et al. |
| 2003/0136333 A1 | 7/2003 | Semond et al. |
| 2004/0009649 A1 | 1/2004 | Kub et al. |
| 2004/0012015 A1 | 1/2004 | Saxler |
| 2004/0033638 A1 | 2/2004 | Bader et al. |
| 2005/0082563 A1 | 4/2005 | Tsai et al. |
| 2005/0133818 A1 | 6/2005 | Johnson et al. |
| 2005/0145851 A1 | 7/2005 | Johnson et al. |
| 2005/0167775 A1 | 8/2005 | Nagy et al. |
| 2005/0285141 A1 | 12/2005 | Piner et al. |
| 2005/0285142 A1 | 12/2005 | Piner et al. |
| 2006/0006500 A1 | 1/2006 | Piner et al. |

FOREIGN PATENT DOCUMENTS

| | | |
|---|---|---|
| WO | WO 96/41906 | 12/1996 |
| WO | WO 01/13436 A1 | 2/2001 |

OTHER PUBLICATIONS

Brown, J.D. et al., "Performance of AlGaN/GaN HFETs Fabricated on 100mm Silicon Substrates for Wireless Basestation Applications," Nitronex Corporation, IEEE MTT-S Digest p. 833 (2004).

Chen, P. et al., "Growth of High Quality GaN Layers With AlN Buffer on Si(111) Substrates," J. Crystal Growth 225:150 (2001).

Chumbes, E., et al., "AlGaN/GaN High Electron Mobility Transistors on Si(111) Substrates", IEEE Transactions on Electron Devices, vol. 48 No. 3 (2001).

Dadgar, A. et al., "Bright, Crack-Free InGaN/GaN Light Emitters on Si(111)," Phys. Stat. Sol. 192(2):308 (2002).

Dadgar, A. et al., "Metalorganic Chemical Vapor Phase Epitaxy of Crack-Free GaN on Si (111) Exceeding 1 μm in Thickness," Jpn. J. Appl. Phys. 39:L1183 (2000).

Dadgar, A. et al., "MOVPE Growth of GaN on Si(111) Substrates," J. Crystal Growth 248:556 (2003).

Elhamri, S. et al., "An Electrical Characterization of a Two Dimensional Electron Gas in GaN/AlGaN on Silicon Substrates," J. Appl. Phys. 95(12):7982 (2004).

Guha, S. et al., "Ultraviolet and Violet GaN Light Emitting Diodes on Silicon," Appl. Phys. Lett. 72(4):415 (1998).

Hageman, P.R. et al., "High Quality GaN Layers on Si(111) Substrates: AlN Buffer Layer Optimisation and Insertion of a SiN Intermediate Layer," Phys. Stat. Sol. 188(2):523 (2001).

Hanson, A.W. et al., "Development of a GaN Transistor Process for Linear Power Applications," Nitronex Corporation, Paper presented at the 2004 International Conference on Compound Semiconductor Manufacturing Technology (GaAs MANTECH), Miami, FL.

Hirosawa, K. et al., "Growth of Single Crystal $Al_2Ga_{1-a}N$ Films on Si Substrates by Metalorganic Vapor Phase Epitaxy," Jpn. J. Appl. Phys. 32:L1039 (1993).

Hobart, K.D., et al., "Bonded Polycrystalline SiC Substrates for the Growth and Fabrication of GaN FETs", The Electrochemical Society, Inc., Proceedings, vol. 2001-27 (2002) 92-99.

Hobart, K.D., et al., "Transfer of Ultrathin Silicon Layers to Polycrystalline SiC Substrates for the Growth of 3C-SiC Epitaxial Films", Journal of the Electrochemical Society, 146 (10) (1999) 3833-3836.

Ishikawa, H. et al., "High-Quality GaN on Si Substrate Using AlGaN/AlN Intermediate Layer," Phys. Stat. Sol. 176:599 (1999).

Johnson, J.W. et al., "12 W/mm AlGaN-GaN HFETs on Silicon Substrates," IEEE Electron Device Lett. 25(7):459 (2004).

Johnson, J.W. et al., "Material, Process, and Device Development of GaN-Based HFETs on Silicon Substrates," Nitronex Corporation, Electrochemical Society Proceedings Jun. 2004, 405 (2004).

Kang, B.S. et al., "Pressure-Induced Changes in the Conductivity of AlGaN/GaN High-Electron Mobility-Transistor Membranes," Appl. Phys. Lett. 85(14):2962 (2004).

Lahreche, H. et al., "Optimisation of AlN and GaN Growth by Metalorganic Vapour-Phase Epitaxy (MOVPE) on Si(111)," J. Crystal Growth 217:13 (2000).

Lee, I. et al., "Growth and Optical Properties of GaN on Si(111) Substrates," J. Crystal Growth 235:73 (2002).

Lei, T. et al., "Epitaxial Growth of Zinc Blende and Wurtzitic Gallium Nitride Thin Films on (001) Silicon," Appl. Phys. Lett. 59(8):944 (1991).

Liu, R. et al., "Atomic Arrangement at the AlN/Si (111) Interface," Appl. Phys. Lett. 83(5):860 (2003).

Nagy, W. et al., "Linearity Characteristics of Microwave Power GaN HEMTs," IEEE Transactions on Microwave Theory & Techniques 51(2):1 (2003).

Nakada, Y. et al., "GaN Heteroepitaxial Growth on Silicon Nitride Buffer Layers Formed on Si (111) Surfaces by Plasma-Assisted Molecular Beam Epitaxy," Appl. Phys. Lett. 73(6):827 (1998).

Nikishin, S.A. et al., "High Quality GaN Grown on Si (111) by Gas Source Molecular Beam Epitaxy with Ammonia," Appl. Phys. Lett. 75(14):2073 (1999).

Nuttinck, S. et al., "Direct On-Wafer Non-Invasive Thermal Monitoring of AlGaN/GaN Power HFETs Under Microwave Large Signal Conditions," Paper Presented at European Microwave Week, Amsterdam, NL (2004).

Ohtani, A. et al., "Microstructure and Photoluminescence of GaN Grown on Si(111) by Plasma-Assisted Molecular Beam Epitaxy," Appl. Phys. Lett. 65(1):61 (1994).

Okamoto, Y. et al., "An 80W AlGaN/GaN Heterojunction FET With a Field-Modulating Plate," IEEE MTT-S Digest p. 225 (2003).

Osinsky, A. et al., "Visible-Blind GaN Schottky Barrier Detectors Grown on Si(111)," Appl. Phys. Lett. 72(5):551 (1998).

Piner, E., "GaN Transistors and Power Amplifiers Close in on Commercialization," Compound Semiconductor (Jul. 2004).

Rajagopal, P. et al., "Large-Area, Device Quality GaN on Si Using a Novel Transition Layer Scheme," Nitronex Corporation, Material Research Society Symposium Proceedings 743(3) (2003).

Rajagopal, P. et al., "MOCVD AlGaN/GaN HFETs on Si: Challenges and Issues," Symposium Y: GAN and Related Alloys, Nitronex Corporation, Material Research Society Symposium Proceedings, 798, 61-66 (2004).

Reitmeier, Z. et al., "Growth and Characterization of AlN and GaN Thin Films Deposited on Si(111) Substrates Containing a Very Thin Al Layer," Dept. Materials Science & Engineering, NC State University.

Semond, F. et al., "GaN Grown on Si(111) Substrate: From Two-Dimensional Growth to Quantum Well Assessment," Appl. Phys. Lett. 75(1):82 (1999).

Seon, M. et al., "Selective Growth on High Quality GaN on Si(111) Substrates," Appl. Phys. Lett. 76(14):1842 (2000).

Singhal, S. et al., "Gallium Nitride on Silicon HEMTs for Wireless Infrastructure Applications, Thermal Design and Performance," Nitronex Corporation, Paper presented at the European Microwave Week, Milan, Italy (2002).

Tanaka, S. et al., "Defect Structure in Selective Area Growth GaN Pyramid on (111)Si Substrate," Appl. Phys. Lett. 76(19):2701 (2000).

Thompson, R. et al., "Improved Fabrication Process for Obtaining High Power Density AlGaN/GaN HEMTs," IEEE GaAs Digest p. 298 (2003).

Vescan, A. et5 al., "AlGaN/GaN HFETs on 100 mm Silicon Substrates for Commercial Wireless Applications," Phys. Stat. Sol. (c) 0(1):52 (2002).

Zhao, Z.M. et al., "Metal-Semiconductor-Metal GaN Ultraviolet Photodetectors on Si(111)," Appl. Phys. Lett. 77(3):444 (2000).

International Search Report and Written Opinion, from PCT/US2006/017098, mailed Feb. 14, 2007.

Kipshidze, G., et al., "High Quality AlN and GaN Grown on Compliant Si/SiC Substrates by Gas Source Molecular Beam Epitaxy", Journal of Electronic Materials, vol. 80, No. 7, 2001, pp. 825-828.

Philippe, A., et al., "Photoluminescence Characteristics of GaN Layers Grown on SOI Substrates and Relation to Material Properties", Mat. Res. Soc. Symp. Proc., vol. 482, 1998, pp. 307-312.

* cited by examiner

GALLIUM NITRIDE MATERIAL STRUCTURES INCLUDING SUBSTRATES AND METHODS ASSOCIATED WITH THE SAME

FIELD OF INVENTION

The invention relates generally to gallium nitride materials and, more particularly, to gallium nitride material structures including substrates, as well as methods associated with the same.

BACKGROUND OF INVENTION

Gallium nitride materials include gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap which permits highly energetic electronic transitions to occur. Such electronic transitions can result in gallium nitride materials having a number of attractive properties including the ability to efficiently emit blue light, the ability to transmit signals at high frequency, and others. Accordingly, gallium nitride materials are being widely investigated in many microelectronic applications such as transistors, field emitters, and optoelectronic devices.

In many applications, gallium nitride materials are grown on a substrate. However, differences in the properties between gallium nitride materials and substrate materials can lead to difficulties in growing layers suitable for certain applications. For example, gallium nitride (GaN) has a different thermal expansion coefficient (i.e. thermal expansion rate) and lattice constant than many substrate materials including sapphire, silicon carbide and silicon. These differences in thermal expansion and lattice constant may lead to the formation of defects (e.g., dislocations) and cracking, as well as warping (e.g., bowing) of the overall structure.

SUMMARY OF INVENTION

The invention provides gallium nitride material structures and methods associated with the same.

In one aspect, a gallium nitride material semiconductor structure is provided. The structure comprises a composite substrate comprising a surface layer. The surface layer has a thickness of less than about 10.0 microns. The structure further comprises a gallium nitride material region formed over the composite having a thickness of greater than about 2.0 microns.

In another aspect, a gallium nitride material semiconductor structure is provided. The structure comprises a substrate having a diameter of at least about 100 mm; and, a gallium nitride material region formed over the substrate having a thickness of greater than 2.0 micron. The structure has a warp of less than about 500 micron.

In another aspect, a gallium nitride material semiconductor structure is provided. The structure comprises a substrate having a diameter of at least about 150 mm; and, a gallium nitride material region formed over the substrate having a thickness of greater than 1.5 micron. The structure has a warp of less than about 500 micron.

In another aspect, a gallium nitride material semiconductor structure is provided. The structure comprises a polycrystalline region and a crystalline layer formed on the polycrystalline region. An amorphous layer is formed on the crystalline layer and a crystalline gallium nitride material region is formed on the amorphous layer.

In another aspect, a method of forming a gallium nitride material semiconductor structure is provided. The method comprises providing a composite substrate comprising a surface layer at a top surface of the substrate. The surface layer has a thickness of less than about 10.0 microns. The method further comprises forming a gallium nitride material region over a substrate having a thickness of greater than about 2.0 micron.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

The invention provides gallium nitride material-based semiconductor structures. In some embodiments, the structures include a composite substrate over which a gallium nitride material region is formed. The composite substrate can include a surface layer, which may be formed of silicon, at a top surface of the substrate. As described further below, the composite substrate structure may be engineered to reduce stresses that may otherwise arise as a result of the formation of the overlying gallium nitride material region, particularly when the gallium nitride material region is relatively thick and/or the substrate diameter is relatively large. The gallium nitride material structures may include additional features, such as strain-absorbing layers and/or transition layers, which also promote favorable stress conditions. The reduction in stresses may reduce defect formation and cracking, as well as reducing warp (and bow) of the overall structure. The gallium nitride material-based semiconductor structures may be used in a variety of applications such as transistors (e.g. FETs) Schottky diodes, light emitting diodes, laser diodes, SAW devices, and sensors, amongst others devices.

Figure 1:
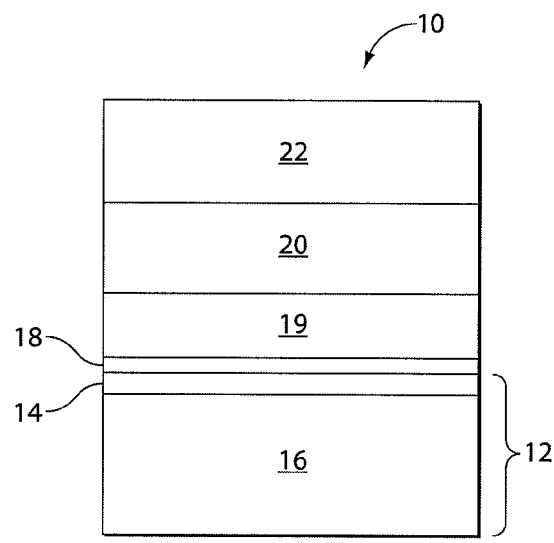
FIG. 1 illustrates a gallium nitride material-based semiconductor structure including a composite substrate according to one embodiment of the present invention.

FIG. 1 illustrates a gallium nitride material-based structure 10 according to one embodiment of the invention. In the illustrative embodiment, the structure includes a composite substrate 12 comprised of a surface layer 14 and a lower portion 16. The structure in this embodiment also includes a strain-absorbing layer 18, an intermediate layer 19, and a transition layer 20 formed between the substrate and a gallium nitride material region 22. As described further below, the composite substrate, strain-absorbing layer and transition layer may contribute to reducing the stress generated by formation of the gallium nitride material region which leads to a number of advantages including improving the quality of the gallium nitride material region and/or reducing the warp (and bow) of the overall structure.

When a layer is referred to as being "on" or "over" another layer or substrate, it can be directly on the layer or substrate, or an intervening layer also may be present. A layer that is "directly on" another layer or substrate means that no intervening layer is present. It should also be understood that when a layer is referred to as being "on" or "over" another layer or substrate, it may cover the entire layer or substrate, or a portion of the layer or substrate.

It should be understood that not all of the features (e.g., layers) shown in FIG. 1 are present in all embodiments of the invention and that the features may be positioned at other locations within the structure. Also, additional layers and/or features may be present in other embodiments. For example, lower portion 16 of the substrate may include more than one layer (e.g., an oxide layer and silicon layer when substrate 12 is an SOI substrate).

In certain preferred embodiments, substrate 12 is designed to generate favorable strain conditions (e.g., lower strain in the gallium nitride material region) in the structure. Such strain conditions can reduce defect generation and crack generation in the gallium nitride material region, as well as reduce the warp (and bow) of the overall structure 10. Reducing strain in the gallium nitride material region is particularly important in structures including substrates having large diameters (e.g., 100 mm or greater) and/or relatively thick gallium nitride material regions (e.g., 1.0 micron or greater). In some cases, surface layer 14 and/or lower portion 16 of the substrate are designed to have particular characteristics to generate favorable strain conditions. For example, the crystal structure and/or composition and/or thickness of the surface layer and/or lower portion may be selected to minimize resulting strain in the gallium nitride material region, as well as for other advantages (e.g., cost), as described further below.

It may be preferable for the surface layer to comprise silicon and, in certain preferred cases, the surface layer is formed entirely of a silicon layer. Suitable composite substrates that have a surface portion formed of a silicon layer include, but are not limited to, substrates such as silicon-on-insulator (SOI), silicon-on-sapphire (SOS), silicon-on-poly SiC, silicon-on-poly AlN, and silicon-on-diamond, amongst others. Some of these substrates are readily available (or, readily produced) and, in some cases, are (or have the potential to be) significantly less expensive than other common substrates used in connection with gallium nitride material structures such as SiC or sapphire which typically are single-crystal when used as substrates.

It is generally preferable for the surface layer to have a single-crystal (i.e., crystalline) structure so that the gallium nitride material region may also have a single-crystal structure (i.e., crystalline). Advantageously, a single crystal silicon surface layer may be formed on lower portions comprising polycrystalline compounds (e.g., SiC, AlN). In particular, the cost of composite substrates including a single-crystal silicon surface layer formed on a polycrystalline compound lower portion (e.g., silicon-on-poly SiC, silicon-on-poly AlN) may be lower than SiC or sapphire substrates. In some cases, the single-crystal silicon has a (111) orientation. As described further below, in certain embodiments, the composition of the lower portion preferably comprises a material (e.g., aluminum nitride, silicon carbide) having a thermal expansion coefficient that is more closely matched with gallium nitride material region than that of the surface layer (e.g., when formed of silicon).

It should be understood that other substrate compositions are also possible including substrates that do not have a silicon layer at the surface. For example, the substrates may include a single crystal surface layer formed of the following materials: GaAs, InP, SiC, ZnO and $ZrB_2$. Though in these embodiments, not all of the advantages of having a silicon layer at the surface may be achieved.

It may be preferable for the surface layer to be thin, particularly when formed of a silicon layer. In some cases, the surface layer (e.g., a silicon layer) may be less than about 10.0 microns or less than about 2.0 microns. In some cases, it may be preferable for the surface layer (e.g., a silicon layer) to be greater than about 0.1 micron to ensure that the portion has sufficiently high quality for growth of subsequent layers, to facilitate further processing of the composite substrate (e.g., when forming backside vias) and to effectively absorb strain, amongst other reasons. The specific thickness of the surface layer depends, in part, on the thickness of the gallium nitride material region, substrate diameter, compositions of the portions, processing conditions, and other device design considerations, amongst other factors.

It has been discovered that surface layers (particularly when formed of silicon) having such thicknesses are particularly effective in absorbing strain associated with formation of the gallium nitride material region. The strain can be absorbed by the generation of elastic strain and/or defects in the surface layer (particularly, when formed of silicon). The presence of the strain and/or defects (if present in limited amounts) in the surface layer may not impair quality of the resulting gallium nitride material region and it is generally preferable for defects to be in the surface layer rather than in the overlying layers and, in particular, the gallium nitride material region. By providing an alternative mechanism for accommodating stress, the presence of the surface layer may reduce the generation of defects and/or cracking and/or warp (and/or bow).

In some embodiments, it may be preferable for the thickness of the surface layer (e.g., when formed of silicon) to be less than, or at least on the same order of magnitude, as the thickness of the gallium nitride material region. For example, the thickness of the surface layer may be within an order of magnitude (i.e., a factor of 10) of the gallium nitride material region. That is, in these embodiments, the surface layer has a thickness less than or equal to 10 times that of the gallium nitride material region; or, in some cases, the thickness of the gallium nitride material region is less than or equal to 10 times that of the surface layer. In some cases, the surface layer has a thickness less than or equal to 5 times that of the gallium nitride material region; or, the thickness of the gallium nitride material region is less than or equal to 5 times that of the surface layer. The balance of these thicknesses may generate favorable strain conditions and may also be beneficial in providing certain devices with desirable electrical resistivity and thermal conductivity properties.

However, it should be understood that, in some cases, the thickness of the surface layer compared to the thickness of the gallium nitride material region may not be within the above-noted ranges.

In some embodiments, it is preferable for the lower portion to be significantly thicker than the surface layer (e.g., when formed of silicon), particularly when the lower portion is formed of a material having a thermal expansion coefficient that is more closely matched with gallium nitride material region than that of the surface layer (e.g., when formed of silicon). In some cases, the lower portion has a thickness of greater than 100 micron; or, greater than 300 micron, or even greater than 500 micron. It has been found that strain may be minimized by controlling the ratio of the thickness of the surface layer to that of the lower portion. In some cases, the ratio may be between about 50:1 and about 50,000:1; or, between about 500:1 and about 5,000:1. The specific ratio depends on a variety of factors including the thickness of the gallium nitride material region, substrate diameter, compositions of the portions, processing conditions, and other device design considerations, amongst other factors. Though, it should be understood that ratios outside the above ranges are also possible.

In some embodiments when the lower portion is significantly thicker than the surface layer, the thickness of the surface layer compared to the thickness of the gallium nitride material region may be within the above-noted ranges. Thus, in these embodiments, the lower portion is thicker than both the surface layer and the gallium nitride material region which have relative thicknesses within the same order of magnitude.

It also should be understood that, in some embodiments, the lower portion may be thinned during processing (e.g., after formation of the gallium nitride material region). In some of these embodiments, the lower portion may not be significantly greater than the surface layer.

In some embodiments, it may be preferable to use substrates having relatively large diameters for gallium nitride material processing (e.g., greater than or equal to 100 mm and/or greater than or equal to about 150 mm) such as about 100 mm (or about 4 inches), about 150 mm (or about 6 inches), or about 200 mm (or about 8 inches), or even about 400 (or about 12 inches). Some of the above-noted suitable composite substrates (e.g., SOI, silicon-on-poly SiC, silicon-on-poly AlN, silicon-on-sapphire) are available or can be readily made at such dimensions, while certain conventional substrates (e.g., SiC and sapphire) used for gallium nitride material are not readily available and cannot readily be made at such dimensions. Large diameters have the advantage of increasing the total device area for a given substrate. Though large diameter substrates generally increase problems associated with strain resulting from gallium nitride material growth, one advantage of the present invention is the ability to generate favorable strain conditions even at such diameters to permit high quality gallium nitride material growth. As described further below, structures of the invention may include features (e.g., strain-absorbing layer, compositionally-graded transition layer) additional to the substrate structure that further promote favorable strain conditions.

In some preferred embodiments, the substrate is substantially planar in the final device or structure. Substantially planar substrates may be distinguished from substrates that are textured and/or have trenches formed therein (e.g., as in U.S. Pat. No. 6,265,289).

The illustrative embodiment of FIG. 1 includes strain-absorbing layer 18 formed on the substrate. It should be understood, however, that certain embodiments of the invention (e.g. FIG. 2) does not include such a strain absorbing layer. As described further below, the strain-absorbing layer can further promote the generation of favorable strain conditions which can limit formation of defect and crack formation, for example, in the gallium nitride material region, as well as reduce warp (and bow) of the overall structure. Suitable strain-absorbing layers have been described in commonly-owned, co-pending U.S. patent application Ser. No. 11/096,505, filed Apr. 1, 2005, and commonly-owned, co-pending U.S. patent application Ser. No. 10/879,703, filed Jun. 28, 2004, both of which are incorporated herein by reference.

In certain preferred embodiments, the strain-absorbing layer is formed of a silicon nitride-based material. Silicon nitride-based materials include any silicon nitride-based compound (e.g., $Si_xN_y$, such as SiN and $Si_3N_4$, SiCN, amongst others) including non-stoichiometric silicon nitride-based compounds. In some embodiments, a SiN strain-absorbing layer may be preferred. Silicon nitride material-based strain-absorbing layers may be particularly preferred when formed directly on a silicon surface layer, as described further below.

It should also be understood that it is possible for the strain-absorbing layer to be formed of other types of materials according to other embodiments of the invention. Though silicon nitride-based strain-absorbing layers are preferred in certain embodiments.

In some embodiments, it is preferable for the strain-absorbing layer to have an amorphous (i.e., non-crystalline) crystal structure. In particular, an amorphous structure may be preferred when formed on a material having a crystalline structure (e.g., a crystalline surface layer of a substrate). Amorphous strain-absorbing layers are particularly effective in accommodating strain and, thus, reducing the generation of misfit dislocations. It should be understood that amorphous strain-absorbing layers, as described herein, are entirely amorphous being free of regions that exhibit a crystalline structure. In some preferred embodiments, amorphous strain-absorbing layers are formed of a silicon nitride-based material as described above.

However, it should be understood that in certain embodiments of the invention the strain-absorbing layer may have a single crystal structure, a poly-crystalline structure, or a structure that includes crystalline and amorphous regions.

In some embodiments, it is preferred for the strain-absorbing layer to be very thin, particularly when formed of amorphous and/or silicon nitride-based materials. It has been discovered that very thin strain-absorbing layers (e.g., silicon nitride-based strain-absorbing layers) may enable formation of overlying layer(s) having an epitaxial relationship with the substrate (e.g., surface layer of the substrate), while also being effective in reducing the number of misfit dislocations. In certain cases (e.g., when the strain-absorbing layer is amorphous), it is desirable for the strain-absorbing layer to have a thickness that is large enough to accommodate sufficient strain associated with lattice and thermal expansion differences between the substrate and the overlying layer(s) (e.g., gallium nitride material region, transition layer, intermediate layer, etc.) to reduce generation of misfit dislocations, amongst other advantages. In these cases, it may also be desirable for the strain-absorbing layer to be thin enough so that the overlying layer(s) have an epitaxial relationship with the substrate. This can be advantageous for formation of a high quality, single crystal gallium nitride material region. If the strain-absorbing layer is too thick, then the overlying layer(s) are not formed with epitaxial relationship with the substrate.

In some embodiments, the strain-absorbing layer has a thickness of less than about 100 Angstroms which, in these embodiments, can allow the epitaxial relationship between the substrate (e.g., when crystalline) and the overlying layer(s) (e.g., when crystalline). In some embodiments, it may be preferable for the strain-absorbing layer to have a thickness of less than about 50 Angstroms to allow for the epitaxial relationship.

The strain-absorbing layer may have a thickness of greater than about 10 Angstroms which, in these embodiments, is sufficient to promote strain accommodation (e.g., resulting from lattice and thermal expansion differences) and can facilitate forming a strain-absorbing layer that covers the entire substrate, as described further below. In other embodiments, the strain-absorbing layer may have a thickness of greater than about 20 Angstroms to sufficiently accommodate strain.

Suitable thickness ranges for the strain-absorbing layer include all of those defined by the ranges described above (e.g., greater than about 10 Angstroms and less than about 100 Angstroms, greater than about 10 Angstroms and less than about 50 Angstroms, and the like). Also, the strain-absorbing layer thickness may be between about 20 Angstroms and about 70 Angstroms.

It should be understood that suitable thicknesses of the strain-absorbing layer may depend on a number of factors including the composition and crystal structure of the strain-absorbing layer; the composition, thickness and crystal structure of the overlying layer(s); as well as the composition, thickness, and crystal structure of the substrate (e.g., surface layer of the substrate), amongst other factors. Suitable thicknesses may be determined by measuring the effect of thickness on misfit dislocation density and other factors (e.g., the ability to deposit overlying layer(s) having an epitaxial relationship with the substrate, etc.). It is also possible for the strain-absorbing layer to have a thickness outside the above ranges.

In some cases, the thickness of the strain-absorbing layer is relatively uniform across the entire layer. For example, in these cases, the strain-absorbing layer may have a thickness uniformity variation of less than 25 percent, or less than 10 percent, across the entire strain-absorbing layer.

As described further below, in some embodiments, the strain-absorbing layer may be formed by nitridating the surface layer of the substrate when formed of silicon. That is, a top region of the silicon surface layer of the substrate may be converted from silicon to a silicon nitride-based material to form the strain-absorbing layer. It should be understood that, as used herein, such strain-absorbing layers may be referred to as being "formed on the substrate", "formed over the substrate", "formed directly on the substrate" and as "covering the substrate". Such phrases also refer to strain-absorbing layers that are formed by depositing a separate layer (e.g., using a separate nitrogen source and silicon source) on the top surface of the substrate and are not formed by converting a surface region of the substrate.

In the illustrative embodiment, the strain-absorbing layer covers substantially the entire top surface of the substrate. This arrangement may be preferable to minimize the number of misfit dislocations in the overlying layer(s). In other embodiments, the strain-absorbing layer may cover a majority of the top surface of the substrate (e.g., greater than 50 percent or greater than 75 percent of the top surface area).

Also, in the illustrative embodiment, the strain-absorbing layer is formed across the entire area between the substrate and its overlying layer (e.g., transition layer). That is, the strain-absorbing layer separates the substrate and its overlying layer at all points with the strain-absorbing layer being directly on the substrate and its overlying layer being directly on the strain-absorbing layer. This arrangement may be preferable to minimize the number of misfit dislocations in its overlying layer. In other embodiments, the strain-absorbing layer may be formed across a majority of the area (e.g., greater than 50 percent, or greater than 75 percent) between the substrate and its overlying layer. If the strain-absorbing layer is not present across the entire (or, at least, the majority of the) area between the substrate and its overlying layer, the above-noted advantages associated with the strain-absorbing layer may not be realized.

The extent that the strain-absorbing layer covers the substrate (and the area between the overlying layer and the substrate) in the present invention may be distinguished from certain prior art techniques in which a discontinuous silicon nitride layer is formed (in some cases, inadvertently) between a silicon substrate and an overlying layer.

It should be understood that, in other embodiments, the strain-absorbing layer may be positioned in other locations such as between two different layers.

As noted above, the presence of the strain-absorbing layer advantageously can result in very low misfit dislocation densities within its overlying layer (e.g., at, or very near, an interface between the strain-absorbing layer and the overlying layer). Misfit dislocations typically are formed at (or, very near) the interface between two materials as a result of incoherency due to differences in atomic structures of the materials.

In some embodiments of the invention, the misfit dislocation density in the layer (e.g., intermediate layer, transition layer, gallium nitride material region) overlying the strain-absorbing layer is less than about $10^{10}$ defects/cm$^2$; and, in other embodiments, less than about $10^8$ defects/cm$^2$. Even lower misfit dislocation densities in the overlying layer may be achieved, for example, less than about $10^5$ defects/cm$^2$. In some cases, the presence of misfit dislocations may not be readily detectable which generally means that the misfit dislocation density is less than about $10^2$ defects/cm$^2$. The specific misfit dislocation density depends, in part, on the particular structure including factors such as the thickness, composition and crystal structure of the strain-absorbing layer; the composition, thickness and crystal structure of the overlying layer; as well as the composition, thickness, and crystal structure of the substrate, amongst other factors.

It should be understood that the above-described misfit dislocation density ranges may be found in the overlying layer (e.g., intermediate layer 19) at, or very near (e.g., 20 nm), the interface with the strain-absorbing layer; and, also may be found at other regions within the overlying layer.

Misfit dislocation density may be measured using known techniques. The techniques generally involve inspection of the atomic structure of a sample (e.g., an interface) using high magnification to determine the presence of misfit dislocations over a representative area. For example, high resolution transmission electron microscopy (TEM) may be used. One suitable technique involves counting the number of dislocations over a representative area using high resolution-TEM images. The misfit dislocation density is calculated by dividing the number of dislocations by the area.

Typically, the misfit dislocation density is expressed in units of defects/cm$^2$.

It should be understood that, in certain embodiments of the invention, the layer overlying the strain-absorbing layer may have misfit dislocation densities greater than the above-noted ranges.

In the illustrative embodiment, as noted above, structure 10 includes intermediate layer 19 that overlies the strain-absorbing layer. It should also be understood that the intermediate layer is optional and not present in certain embodiments of the invention. Suitable nitride-based materials include, but are not limited to, aluminum nitride-based materials (e.g., aluminum nitride, aluminum nitride alloys) and gallium nitride based-materials (e.g., gallium nitride, gallium nitride alloys). Though, in some embodiments, it may be preferred for the intermediate layer to have a low gallium concentration or be free of gallium and formed, for example, of aluminum nitride-based materials. The presence of gallium in the overlying layer can enhance thermal expansion and lattice mismatch differences between the silicon substrate and the overlying layer which can lead to cracking, defect formation, and warp (and bow), amongst other problems.

In some cases, the intermediate layer has a constant composition. Suitable intermediate layers have been described in commonly-owned U.S. Pat. No. 6,649,287, entitled "Gallium Nitride Materials and Methods" filed on Dec. 14, 2000, which is incorporated herein by reference.

It may be preferable for the intermediate layer to have a single crystal (i.e., crystalline) structure. As noted above, in some embodiments, the thickness of the strain-absorbing layer is controlled so that the overlying layer has an epitaxial relationship with the substrate. It may be advantageous for the intermediate layer to have a single crystal structure because it facilitates formation of a single crystal, high quality gallium nitride material region. It should also be understood that the intermediate layer may not have a single crystal structure and may be amorphous or polycrystalline, though all of the advantages associated with the single crystal intermediate layers may not be achieved.

The intermediate layer may have any suitable thickness. For example, the intermediate layer may be between about 10 nanometers and 5 microns, though other thicknesses are also possible.

In the illustrative embodiment, transition layer 20 is formed directly on the intermediate layer. In certain embodiments, such as when the intermediate layer has a constant composition, it may be preferred for the transition layer to be formed of a compositionally-graded material (e.g., a compositionally-graded nitride-based material). Suitable compositionally-graded layers have been described in commonly-owned U.S. Pat. No. 6,649,287 which is incorporated by reference above. Compositionally-graded transition layers have a composition that is varied across at least a portion of the layer. Compositionally-graded transition layers are particularly effective in reducing crack formation in gallium nitride material regions formed on the transition layer by lowering thermal stresses that result from differences in thermal expansion rates between the gallium nitride material and the substrate (e.g., silicon top portion of the substrate). In this manner, the compositionally-graded transition layer promotes favorable stress conditions in the structure. It may be advantageous for the transition layer to have a single crystal structure because it facilitates formation of a single crystal, high quality gallium nitride material region.

According to one set of embodiments, the transition layer is compositionally-graded and formed of an alloy of gallium nitride such as $Al_xIn_yGa_{(1-x-y)}N$, $Al_xGa_{(1-x)}N$, and $In_yGa_{(1-y)}N$. In these embodiments, the concentration of at least one of the elements (e.g., Ga, Al, In) of the alloy is varied across at least a portion of the thickness of the transition layer. When transition layer has an $Al_xIn_yGa_{(1-x-y)}N$ composition, x and/or y may be varied. When the transition layer has a $Al_xGa_{(1-x)}N$ composition, x may be varied. When the transition layer has a $In_yGa_{(1-y)}N$ composition, y may be varied.

In certain preferred embodiments, it is desirable for the transition layer to have a low gallium concentration at a back surface which is graded to a high gallium concentration at a front surface. It has been found that such transition layers are particularly effective in relieving internal stresses within gallium nitride material region 22. For example, the transition layer may have a composition of $Al_xGa_{(1-x)}N$, where x is decreased from the back surface to the front surface of the transition layer (e.g., x is decreased from a value of 1 at the back surface of the transition layer to a value of 0 at the front surface of the transition layer).

In one preferred embodiment, structure 10 includes an aluminum nitride intermediate layer and a compositionally-graded transition layer. The compositionally-graded transition layer may have a composition of $Al_xGa_{(1-x)}N$, where x is graded from a value of 1 at the back surface of the transition layer to a value of 0 at the front surface of the transition layer. The composition of the transition layer, for example, may be graded discontinuously (e.g., step-wise) or continuously. One discontinuous grade may include steps of AlN, $Al_{0.6}Ga_{0.4}N$ and $Al_{0.3}Ga_{0.7}N$ proceeding in a direction toward the gallium nitride material region. In this embodiment, the intermediate layer (e.g., AlN) may also be one of the steps of the compositionally-graded layer.

It should be understood that, in other cases, the transition layer may have a constant composition and may not be compositionally-graded.

The strain-absorbing layer, intermediate layer and/or transition layer are typically (though not always) not part of the active region of the device. As described above, the strain-absorbing layer, intermediate layer and/or transition layer may be formed to facilitate deposition of gallium nitride material region. However, in some cases, the overlying layer and/or transition layer may have other functions including functioning as a heat spreading layer that helps remove heat from active regions of the semiconductor structure during operation of a device. For example, such transition layers that function as heat spreading layers have been described in commonly-owned, co-pending U.S. Patent Application Publication No. 2002-0117695 based on U.S. patent application Ser. No. 09/792,409, entitled "Gallium Nitride Materials Including Thermally-Conductive Regions," filed Feb. 23, 2001, which is incorporated herein by reference.

Active regions of the device may be formed in gallium nitride material region 22. The gallium nitride material region comprises at least one gallium nitride material layer. As used herein, the phrase "gallium nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosporide nitride ($GaAs_aP_bN_{(1-a-b)}$), aluminum indium gallium arsenide phosporide nitride ($Al_xIn_yGa_{(1-x-y)}As_aP_bN_{(1-a-b)}$), amongst others. Typically, when present, arsenic and/or phosphorous are at low concentrations (i.e., less than 5 weight percent). In certain preferred embodiments, the gallium nitride material has a high concentration of gallium and includes little or no amounts of aluminum and/or indium. In high gallium concentration embodiments, the sum of (x+y) may be less than 0.4, less than 0.2, less than 0.1, or even less. In some cases, it is preferable for the gallium nitride material layer to have a composition of GaN (i.e., x+y=0). Gallium nitride materials may be doped n-type or p-type, or may be intrinsic. Suitable gallium nitride materials have been described in commonly-owned U.S. Pat. No. 6,649,287, incorporated by reference above.

In some cases, the gallium nitride material region includes only one gallium nitride material layer. In other cases, the gallium nitride material region includes more than one gallium nitride material layer. For example, the gallium nitride material region may include multiple layers (e.g., 22a, 22b, 22c) as in the embodiment shown in FIG. 3.

In certain embodiments, it may be preferable for the gallium nitride material of layer 22b to have an aluminum concentration that is greater than the aluminum concentration of the gallium nitride material of layer 22a. For example, the value of x in the gallium nitride material of layer 22b (with reference to any of the gallium nitride materials described above) may have a value that is between 0.05 and 1.0 greater than the value of x in the gallium nitride material of layer 22a, or between 0.05 and 0.5 greater than the value of x in the gallium nitride material of layer 22a. For example, layer 22b may be formed of $Al_{0.26}Ga_{0.74}N$, while layer 22a is formed of GaN. This difference in aluminum concentration may lead to formation of a highly conductive region at the interface of the layers 22b, 22a (i.e., a 2-D electron gas region). In the illustrative embodiment, layer 22c may be formed of GaN.

Suitable gallium nitride material layer arrangements have been described, for example, in commonly-owned, co-pending U.S. patent application Ser. No. 10/740,376 entitled "Gallium Nitride Material Devices Including an Electrode-Defining Layer and Methods of Forming the Same," filed Dec. 17, 2003 which is incorporated herein by reference.

The gallium nitride material region is of high enough quality so as to permit the formation of devices therein. As noted above, the substrate structure may be designed to enhance the quality of the gallium nitride material region by creating favorable strain conditions in the gallium nitride material region. Also, the presence of the strain-absorbing layer and/or transition layer (e.g., when compositionally-graded) may also promote favorable strain conditions. The creation of favorable strain conditions may limit defect and crack generation in the gallium nitride material region which can improve device performance. For example, the defect density (including all types) in the gallium nitride material region may be less than or equal to about $10^{10}$ defects/$cm^2$ or less than or equal to about $10^9$ defects/$cm^2$. In some cases, the gallium nitride material region has a crack level of less than 0.005 μm/μm²; in some cases, less than 0.001 μm/μm² and, in certain cases, it may be preferable for the gallium nitride material region to be substantially crack-free as defined by a crack level of less than 0.0001 μm/μm². Gallium nitride materials having low crack levels have been described in U.S. Pat. No. 6,649,287 incorporated by reference above.

In certain cases, the gallium nitride material region includes a layer (or layers) which have a single crystal (i.e., crystalline) structure. In some cases, the gallium nitride material region includes one or more layers having a Wurtzite (hexagonal) structure.

The thickness of gallium nitride material region and the number of different layers are dictated, at least in part, by the requirements of the specific device. At a minimum, the thickness of the gallium nitride material region is sufficient to permit formation of the desired structure or device. As noted above, an advantage of the present invention is to enable growth of relatively thick gallium nitride material regions that are of high quality, even when grown on relatively large diameter substrates (described above). For example, the gallium nitride material region may have a thickness of greater than 1.5 microns, greater than 2.0 microns, or even greater than 5.0 microns in some cases. It should be understood that, in other embodiments, the gallium nitride material region may be thinner than these values. Also, in some cases, the thickness of the gallium nitride material region may be less than 10.0 microns to facilitate processing. As noted above, the thickness of the gallium nitride material region may be greater than, or at least on the same order of magnitude, as the thickness of the silicon surface layer.

It should be understood that the area of the gallium nitride material region may generally be determined from the substrate diameter by assuming that the gallium nitride material region is grown over the entire (or, substantially entire) substrate surface area. Thus, it should be understood that the thickness, defect density and crack density values noted above, are achievable in gallium nitride material regions grown over the entire (or substantially entire) substrate surface area according to methods of the invention. Although, in some embodiments, it is also possible for the gallium nitride material region to be subsequently patterned, or grown over selective regions of the substrate.

As noted above, the structures of the invention may have reduced warp and bow as a result of the reduction in strain within the structure. Such strain can result from growth of the gallium nitride material region due to differences in thermal expansion and lattice constant between the gallium nitride material region and the substrate. As described above, the reduction in strain may result from the substrate structure, as well as presence of the strain-absorbing layer and transition layer. In some embodiments, an arrangement of at least the following regions/layers in the semiconductor structure has been found particularly effective in reducing strain: a polycrystalline semiconductor region (e.g., lower portion of substrate); a crystalline semiconductor layer (e.g., surface layer of substrate); amorphous layer (e.g., strain-absorbing layer); and a crystalline gallium nitride material region.

Warp is the difference between the maximum and minimum distances of the median surface from a reference plane. As used herein, the median surface of a semiconductor wafer is the locus of points in the wafer equidistant between the front and back surfaces. Bow is the difference between the reference plane and the wafer surface height at the center point of the wafer. Both bow and warp are measured on a free, unclamped wafer. Warp and bow can be quantified, for example, using conventional measurement techniques and instruments.

In some embodiments, semiconductor structures of the invention may have a warp (and bow) of less than 500 micron, less than 250 micron or less than 50 micron. In some cases, the warp (and bow) may even be less than 25 micron. These warp (and bow) values are even achievable in structures including the large substrate diameters (e.g., at least about 100 mm, at least about 150 mm, etc.) and/or gallium nitride material region thicknesses (e.g., greater than 1.5 micron, greater than 2.0 micron), noted above. For example, a structure of the invention may comprise a substrate having a diameter of at least about 100 mm and a gallium nitride material region having a thickness of greater than 2.0 micron, while having a warp of less than about 500 micron. Also, a structure of the invention may comprise a substrate having a diameter of at least about 150 mm and gallium nitride material region having a thickness of greater than 1.5 micron, while having a warp of less than about 500 micron. It should be understood that other combinations of these values are also possible including the above-noted warp values at these substrate and thickness values. Also, these warp values are achievable without formation of vias (e.g., etching grooves or laser drilling holes) in the gallium nitride material region which are used in certain prior art techniques to relieve stress. Thus, in some embodiments, the gallium nitride material region may be free of vias (e.g., for stress relief). One aspect of the invention is the reduction of warp and bow on substrates that comprise silicon.

Figure 2:
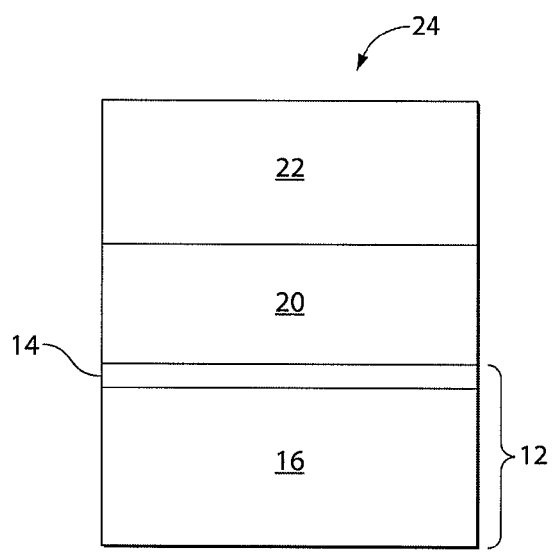
FIG. 2 illustrates a gallium nitride material-based semiconductor structure including a composite substrate according to another embodiment of the present invention.

FIG. 2 illustrates a gallium nitride material-based structure 24 according to another embodiment of the invention. In this illustrative embodiment, the structure does not include a strain-absorbing layer or an intermediate layer.

It should be understood that other variations of the structures illustrated and described herein would be known to those of ordinary skill in the art and are within the scope of the present invention.

The semiconductor structures illustrated in FIGS. 1 and 2 may form the basis of a variety of semiconductor devices. Suitable devices include, but are not limited to, transistors (e.g., FETs), SAW devices, and sensors, as well as light-emitting devices including LEDs and laser diodes. The devices have active regions that are typically, at least in part, within the gallium nitride material region. Also, the devices include a variety of other functional layers and/or features (e.g., electrodes).

Figure 3:
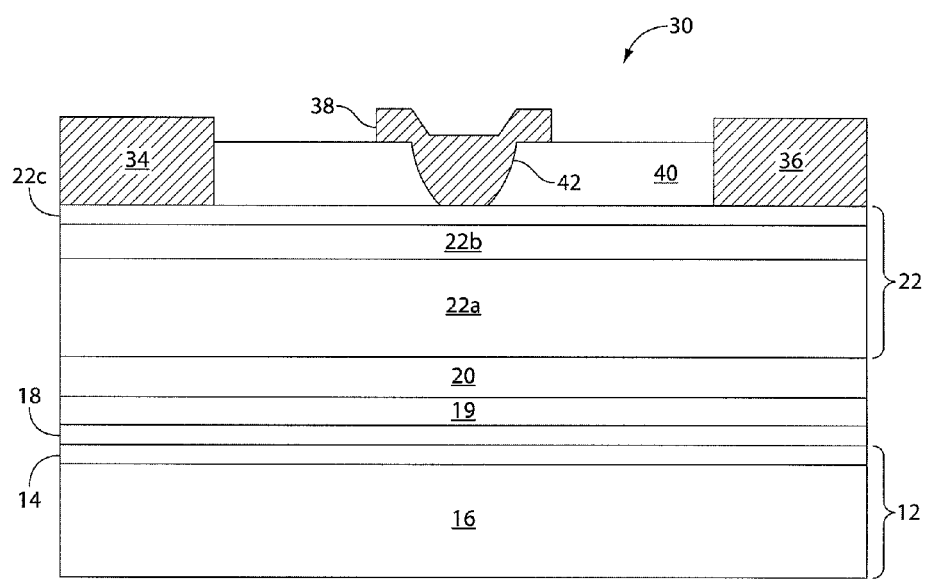
FIG. 3 illustrates a gallium nitride material-based transistor device according to another embodiment of the present invention.

For example, FIG. 3 schematically illustrates a FET device 30 according to one embodiment of the invention which is similar to a FET device described in U.S. patent application Ser. No. 10/740,376, incorporated by reference above, except device 30 includes strain-absorbing layer 18. Device 30 includes a source electrode 34, a drain electrode 36 and a gate electrode 38 formed on gallium nitride material region 22 (which includes a first layer 22b and a second layer 22a). The device also includes an electrode defining layer 40 which, as shown, is a passivating layer that protects and passivates the surface of the gallium nitride material region. A via 42 is formed within the electrode defining layer in which the gate electrode is, in part, formed. Strain-absorbing layer 18 is formed directly on the substrate and intermediate layer 19 is formed directly on the strain-absorbing layer. In some embodiments, the intermediate layer may have a constant composition (e.g., aluminum nitride or an aluminum nitride alloy) and a compositionally-graded transition layer is formed on the strain-absorbing layer.

It should also be understood that devices of the invention may include further features than those illustrated herein. For example, structures and devices of the invention may include backside vias. Suitable backside vias and techniques for making the same are described in commonly-owned U.S. Pat. No. 6,611,002 entitled "Gallium Nitride Material Devices and Methods Including Backside Vias" which is incorporated herein by reference.

Semiconductor structures of the invention may be manufactured using known semiconductor processing techniques.

Certain substrates of the invention, including composite substrates, are commercially available such as silicon-on-insulator (SOI) substrates. It also is possible, for example, to produce composite substrates including a silicon surface layer on a polycrystalline lower portion using conventional wafer bonding and layer transfer processes. For example, to produce a silicon-on-poly SiC structure, the silicon surface layer (e.g., Si(111)) above the oxide layer of an SOI wafer (e.g., 2 micron Si(111)/0.5 micron $SiO_2$/Si(100)) may be bonded to a polysilicon wafer. The silicon portion below the oxide layer (e.g., Si(100)) may be removed by grinding and/or etching and the oxide portion (e.g., $SiO_2$) may be removed by etching to produce a composite substrate having a silicon surface layer.

In embodiments in which the strain-absorbing layer is a silicon nitride-based material (e.g., amorphous SiN), the strain-absorbing layer may be formed by nitridating the silicon surface of the substrate as noted above. In a nitridation process, nitrogen reacts with the silicon surface layer to form a silicon nitride-based layer. The top surface may be nitridated by exposing the silicon substrate to a gaseous source of nitrogen at elevated temperatures in a CVD process such as an MOCVD process. For example, ammonia may be introduced into a reaction chamber in which the substrate is positioned. The temperature in the reaction chamber may be greater than 950° C., such as between about 1000° C. and about 1400° C., or, more typically, between about 1000° C. and about 1100° C. The pressure may be greater than about 1 torr, such as between about 1 torr and about $10^3$ torr, or, more typically, between about 20 torr and about 40 torr (in some cases, about 30 torr). The reaction between nitrogen and the silicon substrate is allowed to proceed for a reaction time (e.g., less than 30 seconds) selected to produce a layer having a desired thickness.

It should be understood that other processes may be used to form silicon nitride-based strain-absorbing layers including processes (e.g., CVD processes) that use separate nitrogen and silicon sources. Also, when the strain-absorbing layer is formed of another type of material (non-silicon nitride-based material), other deposition processes known in the art are used.

In some embodiments, the strain-absorbing layer may be formed in-situ with the overlying layer(s) of the structure. That is, the strain-absorbing layer may be formed during the same deposition process (e.g., MOCVD process) as the overlying layer(s). In MOCVD processes that grow a silicon nitride-based material strain-absorbing layer by introducing a nitrogen source (e.g., ammonia) into a reaction chamber as described above, a second source gas may be introduced into the chamber after a selected time delay after the nitrogen source. The second source reacts with the nitrogen source to form the overlying layer, thus, ending growth of the strain-absorbing layer. For example, when the overlying layer is formed of aluminum nitride, an aluminum source (e.g., trimethylaluminum) is introduced into the chamber at a selected time after the nitrogen source (e.g., ammonia). The time delay is selected so that the strain-absorbing layer grows to a desired thickness. The reaction between the second source (e.g., aluminum source) and the nitrogen source is allowed to proceed for a sufficient time to produce the overlying layer. To simplify the process, in some embodiments, it is preferred that the overlying layer(s) and the strain-absorbing layer are formed in the same MOCVD process which may have the same reaction conditions (e.g., temperature, pressure). Growing the strain-absorbing and overlying layers with an MOCVD process is particularly preferred in the present invention in order to produce high quality gallium nitride.

When the overlying layer(s) have a single crystal structure, the reaction conditions are selected appropriately. For example, the reaction temperature may be greater than 950°

C., such as between about 1000° C. and about 1400° C., or, more typically, between about 1000° C. and about 1100° C. In some cases, lower growth temperatures may be used including temperatures between about 500° C. and about 600° C., though higher temperatures may be preferred in order to produce higher quality material. The pressure may be greater than about 1 torr, such as between about 1 torr and about $10^3$ torr; or, more typically, between about 20 torr and about 40 torr (in some cases, about 30 torr). It should also be understood that the strain-absorbing layer may be formed in a separate process than the overlying layer(s). For example, the strain-absorbing layer may be formed on the substrate in a first process. Then, at a later time, the overlying layers may be formed on the strain-absorbing layer in a second process.

In the processes described above, the overlying layer(s) are grown in a vertical growth process. That is, the overlying layer(s) are grown in a vertical direction with respect to the strain-absorbing layer. The ability to vertically grow the strain-absorbing layer having low misfit dislocation densities may be advantageous as compared to lateral growth processes which may be more complicated.

As noted above, the overlying layer(s) (e.g., intermediate layer, transition layer and gallium nitride material region) may also be grown in the same deposition step as the strain-absorbing layer. In such processes, suitable sources are introduced into the reaction chamber at appropriate times. Suitable MOCVD processes to form the intermediate layer, compositionally-graded transition layer and gallium nitride material region have been described in U.S. Pat. No. 6,649,287 incorporated by reference above. When the gallium nitride material region has different layers, in some cases, it is preferable to use a single deposition step to form the entire region. When using the single deposition step, the processing parameters may be suitably changed at the appropriate time to form the different layers.

In other embodiments of the invention (not shown), it is possible to grow, at least a portion of, the gallium nitride material region using a lateral epitaxial overgrowth (LEO) technique that involves growing an underlying gallium nitride layer through mask openings and then laterally over the mask to form the gallium nitride material region, for example, as described in U.S. Pat. No. 6,051,849.

In other embodiments of the invention (not shown), it is possible to grow the gallium nitride material region using a pendeoepitaxial technique that involves growing sidewalls of gallium nitride material posts into trenches until growth from adjacent sidewalls coalesces to form a gallium nitride material region, for example, as described in U.S. Pat. No. 6,265,289. In these lateral growth techniques, gallium nitride material regions with very low defect densities are achievable. For example, at least a portion of the gallium nitride material region may have a defect density of less than about $10^5$ defects/cm$^2$.

Commonly-owned, co-pending U.S. patent application Ser. No. 10/740,376, incorporated by reference above, further describes techniques used to grow other layers and features shown in the embodiment of FIG. 3.

It should also be understood that other processes may be used to form structures and devices of the present invention as known to those of ordinary skill in the art.

The following example is meant to be illustrative and is not limiting.

EXAMPLE

This example illustrates formation of a gallium nitride material-based structure including a composite substrate and characterization of the structure.

Figure 4:
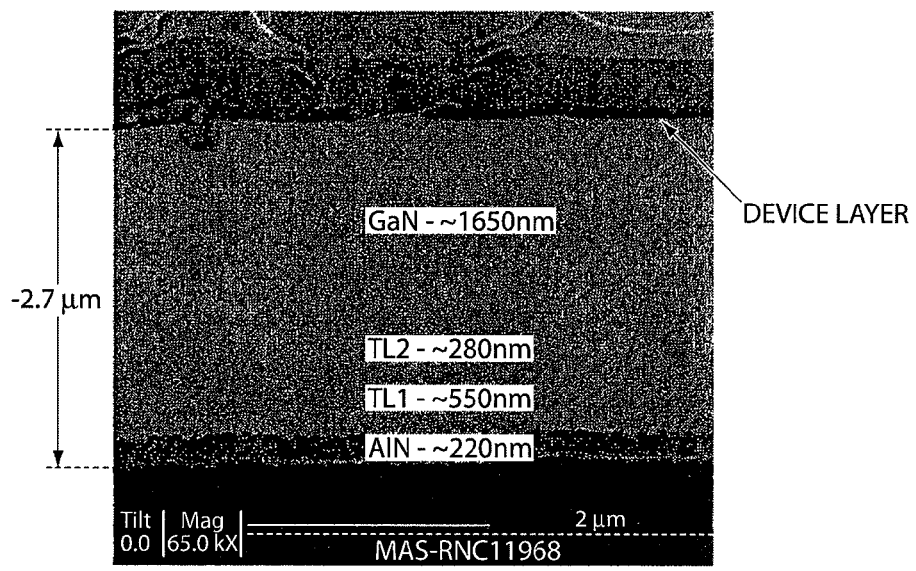
FIG. 4 is a copy of a scanning electron microscope image of a cross-section of a gallium nitride material-based structure including a composite substrate as described in Example 1.

A gallium nitride-based structure was produced. The structure included a composite substrate (100 mm diameter) which comprised a 2 micron Si (111) surface layer formed on a poly SiC lower portion. The structure included a very thin (e.g., less than 50 Angstroms) amorphous silicon nitride-based strain absorbing layer formed on the composite substrate and a compositionally-graded $Al_xGa_{1-x}N$ transition layer (including steps of AlN, $Al_{0.6}Ga_{0.4}N$, and $Al_{0.3}Ga_{0.7}N$) formed on the strain absorbing layer; and, a crack-free gallium nitride material region formed on the transition layer. The gallium nitride material region comprised a GaN buffer layer (thickness=1.65 micron) and an $Al_{0.2}Ga_{0.8}N$ device layer (thickness=0.03 micron). The total thickness of the gallium nitride material region was about 1.7 micron. The structure was further processed to include Ti/Al/Ni/Au source and drain ohmic contacts, a Ni/Au Schottky gate with ~0.7 micron gate length, and a $SiN_x$ passivant deposited by plasma enhanced chemical vapor deposition. FIG. 4 is a copy of a scanning electron microscope image of the cross-section of the structure.

Figure 5:
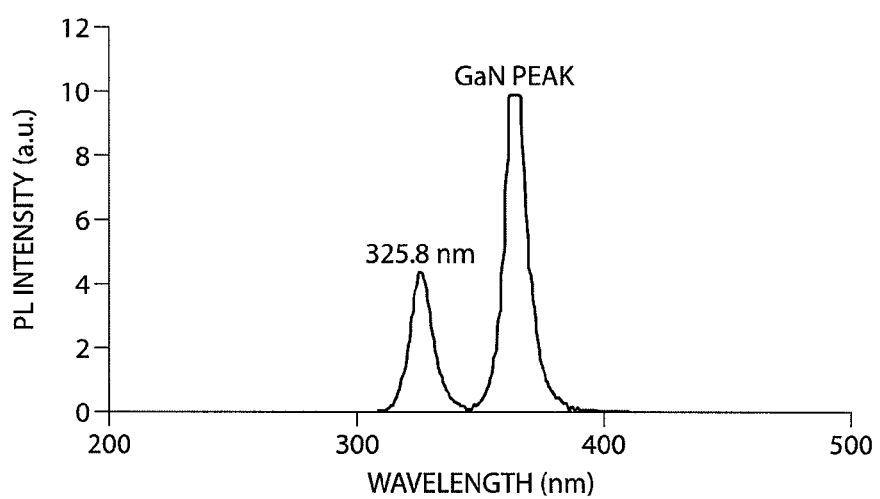
FIG. 5 shows a PL spectrum taken from the structure described in Example 1.
Figure 6:
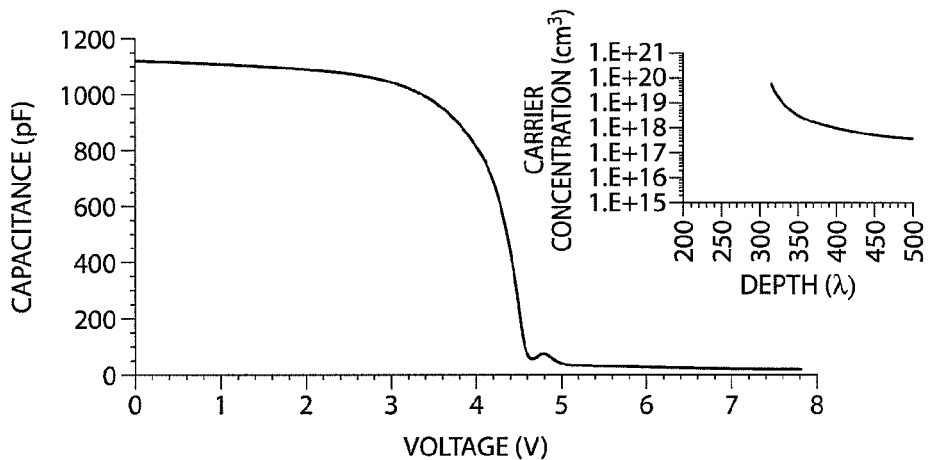
FIG. 6 shows a C—V sweep of the $Al_{0.20}Ga_{0.80}N$ device layer as described in Example 1.

The structure was characterized using Hg-probe capacitance-voltage (CV) measurement, eddy current sheet resistance mapping, and room temperature photoluminescence (RT PL). RT PL and C—V were used to verify the alloy content of the device layer and to confirm the presence of an electron channel. FIG. 5 shows a PL spectrum. The excitation source used was a 266 nm quad-YAG laser. The acquisition conditions used resulted in a saturated GaN peak and an emission peak of 325.8 nm from the $Al_xGa_{1-x}N$ device layer, which corresponds to an alloy content of x≅20% (alloy bowing parameter=1 assumed). FIG. 6 shows a C—V sweep of the $Al_{0.20}Ga_{0.80}N$ device layer which exhibits good pinch off behavior. The inset in FIG. 6 displays the calculated carrier concentration vs. depth from the C—V profile. Based on this data, the $Al_{0.20}Ga_{0.80}N$ device layer was determined to be about 315 Angstrom thick.

Figure 7:
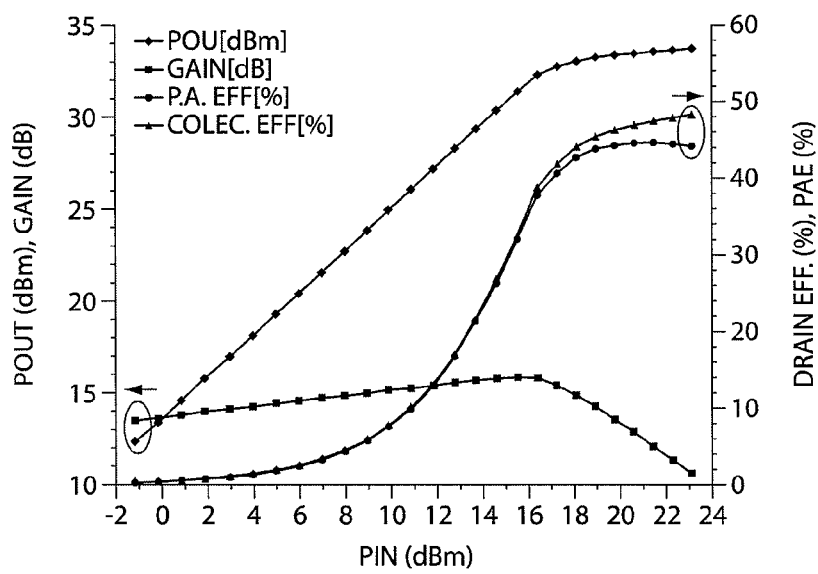
FIG. 7 shows a power sweep of a 2 mm gate periphery $Al_{0.20}Ga_{0.80}N$/GaN HFET as described in Example 1.

DC measurements made on a 100 micron gate periphery device resulted in a maximum transconductance value of 120 mS/mm and a maximum drain current of ~500 mA/mm. CW power sweeps were taken at a frequency of 2.14 GHz on devices with a gate periphery of 2 mm (200 micron gate width×10 fingers) and source-gate and drain-gate distances of 1 micron and 3 micron respectively. FIG. 7 shows a power sweep of a 2 mm gate periphery $Al_{0.20}Ga_{0.80}N$/GaN HFET. Power densities of 1.2 W/mm and a maximum efficiency of 49% were achieved using a bias condition of 15V on the drain and an $I_{dq}$ of 25% $I_{dss}$.

The results validate the feasibility of fabricating AlGaN/GaN HFETs on Si/poly SiC composite substrates. The Si/poly SiC composite substrates appear capable of accommodating thicker crack-free epi, which can be attributed to a smaller thermal mismatch than for AlGaN/GaN grown directly on Si substrates. An explanation for this is that the thin Si(111) is compliant to the thick poly SiC, which influences the thermal expansion mismatch relationship and results in a smaller thermal expansion mismatch compared to a conventional Si(111) substrate. Working devices were demonstrated with reasonable power density and efficiency.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A gallium nitride material semiconductor structure comprising:
   a composite substrate comprising a silicon surface layer and a lower portion on which the substrate is formed, the surface layer having a thickness of less than 10.0 microns, wherein the substrate has a diameter of at least 100 mm; and
   a gallium nitride material region formed over the composite having a thickness of greater than 2.0 microns, wherein the structure has a warp of less than 250 micron.

2. The structure of claim 1, wherein the surface layer has a thickness of between 0.1 micron and 10.0 microns.

3. The structure of claim 1, wherein the thickness of the gallium nitride material region is within an order of magnitude of the thickness of the surface layer.

4. The structure of claim 1, wherein the lower portion has a thickness of greater than at least 10 times the thickness of the silicon layer.

5. The structure of claim 1, wherein the lower portion comprises a polycrystalline material.

6. The structure of claim 1, further comprising a silicon nitride-based layer formed directly on the substrate.

7. The structure of claim 6, wherein the silicon nitride-based layer has an amorphous crystal structure and a thickness of less than 100 Angstroms.

8. The structure of claim 1, further comprising a transition layer formed over the substrate, wherein the transition layer comprises a gallium nitride alloy and a gallium concentration in the transition layer increases from a back surface to a top surface of the transition layer.

9. The structure of claim 1, wherein the gallium nitride material region has a misfit dislocation density of less than $10^{10}$ defects/cm$^2$.

10. The structure of claim 1, wherein the gallium nitride material region includes more than one gallium nitride material layer.

11. The structure of claim 1, wherein the substrate is selected from the group consisting of silicon-on-insulator, silicon-on-poly SiC, and silicon-on-poly AlN.

12. A gallium nitride material semiconductor structure comprising:
    a substrate comprising silicon and having a diameter of at least 100 mm; and
    a gallium nitride material region formed over the substrate having a thickness of greater than 2.0 micron,
    wherein the structure has a warp of less than 500 micron.

13. The structure of claim 12, wherein the substrate is a composite substrate that comprises a silicon layer at a top surface of the substrate.

14. The structure of claim 13, wherein the composite substrate includes a lower portion on which the silicon layer is formed, the lower portion having a thickness of greater than at least 10 times the thickness of the silicon layer.

15. The structure of claim 12, further comprising a silicon nitride-based layer formed directly on the substrate having a thickness of less than 100 Angstroms; and, a transition layer formed over the substrate, wherein the transition layer comprises a gallium nitride alloy and a gallium concentration in the transition layer increases from a back surface to a top surface of the transition layer.

16. A gallium nitride material semiconductor structure comprising:
    a substrate comprising silicon and having a diameter of at least about 150 mm; and
    a gallium nitride material region formed over the substrate having a thickness of greater than 1.5 micron,
    wherein the structure has a warp of less than 500 micron.

17. The structure of claim 16, wherein the substrate has a warp of less than 250 micron.

18. The structure of claim 16, wherein the substrate is a composite substrate comprising a silicon layer at a top surface of the substrate.

19. The structure of claim 16, wherein the substrate has a warp of less than 250 micron.

* * * * *